(12) United States Patent
Hur et al.

(10) Patent No.: US 8,563,429 B2
(45) Date of Patent: Oct. 22, 2013

(54) METHODS OF FORMING A METAL SILICIDE LAYER FOR SEMICONDUCTOR DEVICES

(75) Inventors: Won-Goo Hur, Incheon (KR); Kyu-Tae Na, Seoul (KR); Min Kim, Seoul (KR); Hyun-Young Kim, Hwaseong-si (KR); Je-Hyeon Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 560 days.

(21) Appl. No.: 12/704,873

(22) Filed: Feb. 12, 2010

(65) Prior Publication Data

US 2010/0210099 A1    Aug. 19, 2010

(30) Foreign Application Priority Data

Feb. 16, 2009    (KR) .................. 10-2009-0012507

(51) Int. Cl.
| | | |
|---|---|---|
| *H01L 21/44* | (2006.01) | |
| *H01L 21/302* | (2006.01) | |
| *H01L 21/461* | (2006.01) | |
| *H01L 21/336* | (2006.01) | |
| *H01L 21/8234* | (2006.01) | |
| *H01L 21/8238* | (2006.01) | |

(52) U.S. Cl.
USPC ........... 438/655; 438/721; 438/734; 438/749; 438/755; 257/E21.438; 257/E21.622; 257/E21.636

(58) Field of Classification Search
USPC ......... 438/586, 597, 630, 649, 651, 655, 664, 438/674, 682, 689, 706–744
See application file for complete search history.

(56) References Cited

U.S. PATENT DOCUMENTS

| | | | | |
|---|---|---|---|---|
| 5,505,816 | A * | 4/1996 | Barnes et al. | 438/695 |
| 7,001,842 | B2 | 2/2006 | Kim | |
| 2008/0085593 | A1* | 4/2008 | Miyagawa | 438/591 |
| 2008/0268645 | A1* | 10/2008 | Kao et al. | 438/694 |
| 2008/0305630 | A1* | 12/2008 | Fukuhara | 438/664 |

FOREIGN PATENT DOCUMENTS

| | | |
|---|---|---|
| JP | 2008-078298 | 4/2008 |
| JP | 2008-098504 | 4/2008 |
| KR | 1020050058637 A | 6/2005 |
| KR | 10-0567879 | 3/2006 |
| KR | 1020080026509 A | 3/2008 |

* cited by examiner

*Primary Examiner* — Calvin Choi
(74) *Attorney, Agent, or Firm* — Myers Bigel Sibley & Sajovec, P.A.

(57) ABSTRACT

Methods of forming a metal silicide layer are provided that include exposing polysilicon through just dry etching (JDE) and recessesing an oxide layer through chemical dry etching (CDE). In particular, dry etching is primarily performed to an extent to expose the polysilicon. Then, CDE is secondarily performed to expose the polysilicon. The CDE process includes selecting an etchant source among combinations of $NF_3$ and $NH_3$, HF and $NH_3$, and $N_2$, $H_2$, and $NF_3$, dissociating the etchant source, forming an etchant of $NH_4F$ and $NH_4F.HF$ through the dissociation, producing solid by-products of $(NH_4)_2SiF_6$ through the reaction between the etchant and an oxide at a low temperature, and annealing the by-products at a high temperature such that the by-products are sublimated into gas-phase $SiF_4$, $NH_3$, and HF.

18 Claims, 9 Drawing Sheets

METHODS OF FORMING A METAL SILICIDE LAYER FOR SEMICONDUCTOR DEVICES

RELATED APPLICATION DATA

This application claims the benefit under 35 U.S.C. §119 from Korean Patent Application No. 10-2009-0012507, filed on Feb. 16, 2009, the contents of which are hereby incorporated herein by reference in its entirety.

FIELD OF INVENTION

Example embodiments relate to methods of forming a metal silicide layer of a semiconductor device, which may form polysilicon interconnected in a line-and-space (L/S) pattern such as a gate electrode or word line in a self-aligned silicide (salicide) structure, and more specifically, to methods of forming metal interconnections of a semiconductor device, in which dry etching may be performed to expose polysilicon and then a dry-type chemical etching process recessing an oxide layer between the polysilicon structures may be performed to open the polysilicon.

BACKGROUND

As semiconductor devices become highly integrated, not only do the sizes of patterns formed on a chip decrease, but the interval therebetween also decreases. At one time, polysilicon was a useful material as an interconnection material such as between gate electrodes and word lines. However, as the size of patterns decreases, resistivity of the polysilicon may become too high, resulting in resistive-capacitive (RC) time delay and voltage (IR) drop. Further, to improve a short-channel effect and punch-through caused by a reduction in gate length of a transistor, the junction depth of source and drain regions may be reduced, and simultaneously, parasitic resistance of the source and drain regions, for example, sheet resistance and contact resistance, may be reduced.

SUMMARY

Embodiments of the present invention provide a salicide process that may be used as a novel metallization process, in which silicide may be formed on the surface of a gate and source and drain regions to reduce resistivity of the gate and parasitic resistance of the source and drain regions. The salicide process may involve selectively forming silicide only at a gate electrode and source and drain regions. In some embodiments, the silicide may be formed of titanium silicide ($TiSi_2$) or a group VIII silicide (such as $PtSi_2$, $PdSi_2$, $CoSi_2$, or $NiSi_2$). Additionally, in a non-volatile memory device having a vertically stacked gate structure including a tunnel oxide pattern, a floating gate pattern, a dielectric pattern, and a control gate pattern formed on a silicon substrate, as a design rule is reduced to less than 0.1 μm, the salicide process may be applied to reduce the resistance of the control gate provided as a word line, and a silicide layer, for example, cobalt silicide ($CoSi_2$), may be selectively formed only on the gate.

Further, example embodiments provide a method of forming a metal silicide layer of a semiconductor device, which may minimize a loss of polysilicon such that the line width of an exposed portion of the polysilicon composing a gate is not significantly reduced in comparison with that of an unexposed portion of the polysilicon, at least because the sizes of gate patterns of the polysilicon and the intervals between the patterns decrease according to the high integration of semiconductor devices.

Example embodiments also provide a method of forming a metal silicide layer of a semiconductor device, in which even when a void occurs between neighboring gates during oxide deposition, a silicon active region may not be damaged, at least because the interval between gates decreases and an aspect ratio of the gates increases as a design rule is reduced.

Example embodiments further provide a method of forming a metal silicide layer of a semiconductor device, which may recess an oxide layer between gates with minimal contamination, if any, on other portions, in order to minimize reduction in formation amount of the silicide layer, minimize an increase in the central value of gate resistance, and decrease defective distribution, which may occur when a recess degree of the oxide layer between gates is small.

Example embodiments are also directed to a method of forming a metal silicide layer of a semiconductor device, including: forming a line-and-space shaped gate structure on a semiconductor substrate; depositing an oxide layer on the entire surface of the semiconductor substrate having the gate structure formed thereon; depositing a polishing stop layer on the entire surface of the oxide layer; depositing an interlayer insulating layer on the entire surface of the polishing stop layer; polishing the interlayer insulating layer up to the surface of the polishing stop layer; etching the interlayer insulating layer, the polishing stop layer, and the oxide layer through just dry etching (JDE) such that the entire upper surface and partial side surfaces of the gate structure are exposed; recessing the oxide layer between the gate structures through chemical dry etching (CDE) such that the side surfaces of the gate structure are further exposed; and forming a silicide layer at portions including at least the exposed portion of the gate structure.

In example embodiments, the gate structure may include a tunnel oxide pattern, a floating gate pattern, a dielectric pattern, and a control gate pattern which are sequentially stacked, the floating gate and the control gate may be formed of polysilicon, and the dielectric layer may be formed of an oxide-nitride-oxide (ONO) layer on which an oxide layer, a nitride layer, and an oxide layer are sequentially stacked.

In example embodiments, an etching end point in the JDE may be determined in such a range that a part of an exposed side surface of the polysilicon does not exceed about 200 Å.

In example embodiments, an etching end point in the CDE may be determined in such a range that the ONO dielectric layer may not be exposed and a part of an exposed side surface of the polysilicon is in a range of about 500 to 1000 Å.

In example embodiments, the CDE may include selecting an etchant source among combinations of $NF_3$ and $NH_3$, HF and $NH_3$, and $N_2$, $H_2$, and $NF_3$, dissociating the etchant source using one selected from plasma, remote plasma, and heat, and forming an etchant of $NH_4F$ and $NH_4F \cdot HF$ through the dissociation reaction; producing solid by-products of $(NH_4)_2SiF_6$ through the reaction between the etchant and oxide ($SiO_2$) at a low temperature; and applying high-temperature heat such that the produced by-products are converted into gas-phase $SiF_4$, $NH_3$, and NH and then removed.

In example embodiments, the low temperature may be equal to or less than 35° C., and the high temperature may be equal to or more than 100° C.

In example embodiments, forming the silicide layer at the exposed portion of the polysilicon may include: depositing a metal layer in-situ with a capping layer formed of titanium nitride (TiN) to cover at least the exposed surface of the polysilicon using a metal selected from cobalt (Co), nickel (Ni), molybdenum (Mo), and titanium (Ti); performing a first rapid thermal annealing (RTA) process on the metal layer and the capping layer such that the polysilicon and the metal layer react to form a metal silicide layer; stripping the metal layer and the capping layer deposited at unexposed portions of the polysilicon; and performing a second RTA process on the metal silicide layer to provide a stable phase.

In example embodiments, when the metal layer selected from Co, Ni, Mo, and Ti is deposited at a high temperature of 300° C. or more to improve thermal resistance through a subsequent thermal process, a predetermined amount of oxide layer may be formed on the polysilicon after the CDE, in order to prevent abnormal growth of the silicide layer.

Other example embodiments are directed to a method of forming a metal silicide layer of a semiconductor device, including performing polishing up to an upper portion of line-and-space configured polysilicon; exposing an upper surface of the polysilicon through JDE; recessing an oxide layer between the polysilicon and the polysilicon through CDE and exposing side surfaces of the polysilicon; and forming a silicide layer on the polysilicon through metal deposition. The CDE includes dissociating $NF_3$ and $NH_3$ using plasma to form an etchant of $NH_4F$ and $NH_4F.HF$; producing solid by-products of $(NH_4)_2SiF_6$ through the reaction between the etchant and oxide at a temperature of 35° C. or less; and annealing the by-products at a temperature of 100° C. or more such that solid-phase $(NH_4)_2SiF_6$ is sublimated into gas-phase $SiF_4$, $NH_3$, and HF.

Still other example embodiments are directed to a method of forming a metal silicide layer of a semiconductor device, including exposing an upper surface of line-and-space configured polysilicon through polishing; recessing an oxide layer between the polysilicon structures through CDE and exposing side surfaces of the polysilicon; and forming a silicide layer on the polysilicon through metal deposition. The CDE includes selecting an etchant source among combinations of $NF_3$ and $NH_3$, HF and $NH_3$, and $N_2$, $H_2$, and $NF_3$; dissociating the etchant source using one selected from plasma, remote plasma, and heat; dissociating $NF_3$ and $NH_3$ using plasma to form an etchant of $NH_4F$ and $NH_4F.HF$; producing solid by-products of $(NH_4)_2SiF_6$ through the reaction between the etchant and oxide at a temperature of 35° C. or less; and annealing the by-products at a temperature of 100° C. or more such that solid-phase $(NH_4)_2SiF_6$ is sublimated into gas-phase $SiF_4$, $NH_3$, and HF.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Hereinafter, a method of forming a metal silicide layer of a semiconductor device according to example embodiments will be described in detail with reference to the accompanying drawings.

Figure 1:
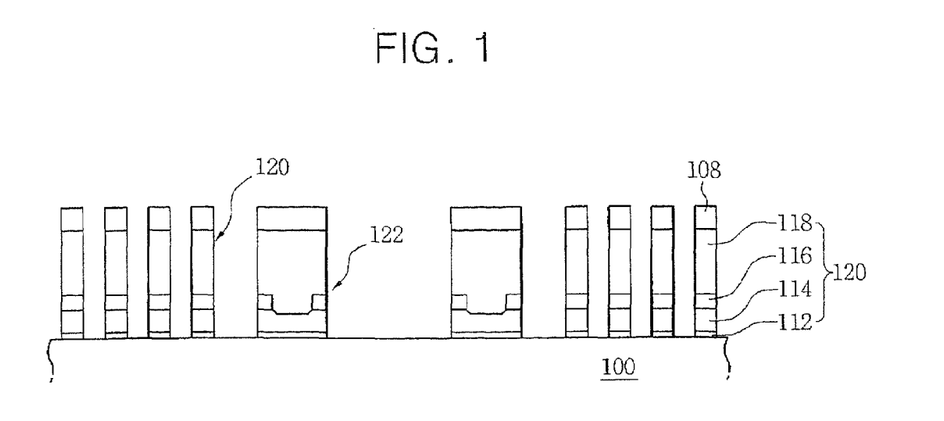
FIG. 1 is a cross-sectional view showing a method of forming a stacked gate structure on a semiconductor substrate according to example embodiments.

As shown in FIG. 1, a stacked gate structure 120 may be formed on a semiconductor substrate 100. The stacked gate structure 120 may include a tunnel oxide pattern 112, a floating gate pattern 114, a dielectric pattern 116, and a control gate pattern 118 which may be sequentially stacked. The floating gate pattern 114 and the control gate pattern 118 may be formed of a polysilicon layer, and the dielectric layer 116 may be formed of an oxide/nitride/oxide (ONO) layer in which an oxide layer, a nitride layer, and an oxide layer may be sequentially stacked. Reference numeral 108 represents an oxide layer used as a mask.

The process of forming the gate structure will be described in further detail as follows.

Although not shown in the drawing, a tunnel oxide layer may be formed on the semiconductor substrate 110 through a thermal oxidation process. The tunnel oxide layer may be formed of silicon oxide or silicon oxynitride. On the tunnel oxide layer, a floating gate layer may be deposited. The floating gate layer may be formed of polysilicon or amorphous silicon. Then, the floating gate layer may be highly doped with n-type impurity ions using a typical doping method.

Subsequently, a photolithography process may be performed on the tunnel oxide layer and the floating gate layer. The floating gate layer and tunnel oxide layer on a field region may be removed using the first etch mask to isolate tunnel oxide patterns 112 and floating gate patterns 114 of neighboring memory cells from each other. Then, an ONO dielectric layer, in which a silicon dioxide ($SiO_2$) layer having an improved leakage current characteristic and relatively low permittivity and a silicon nitride ($Si_3N_4$) layer having relatively high permittivity are combined, may be formed on the resulting structure. The dielectric layer may be formed by a thermal oxidation process or a chemical vapor deposition (CVD) process.

A control gate layer may be formed on the dielectric layer. The control gate layer may be formed of polysilicon or amorphous silicon. Finally, a photolithography process may be performed on the dielectric layer and the control gate layer. The dielectric layer and control gate layer on the field region may be removed using a second etch mask. As the control gate layer and the dielectric layer are sequentially dry-etched, the stacked gate structure 120 including the tunnel oxide pattern 112, the floating gate pattern 114, the dielectric pattern 116, and the control gate pattern 118 may be completed.

As such, a plurality of word lines (WL) composed of the gate structures 120 may be arranged in parallel on the semiconductor substrate 100. When the word lines are formed, a string selection line (SSL) or ground selection line (GSL) may be formed simultaneously at one side of the word lines. The SSL or GSL may be composed of a second gate structure 122 having a single gate, unlike the WL.

Figure 2:
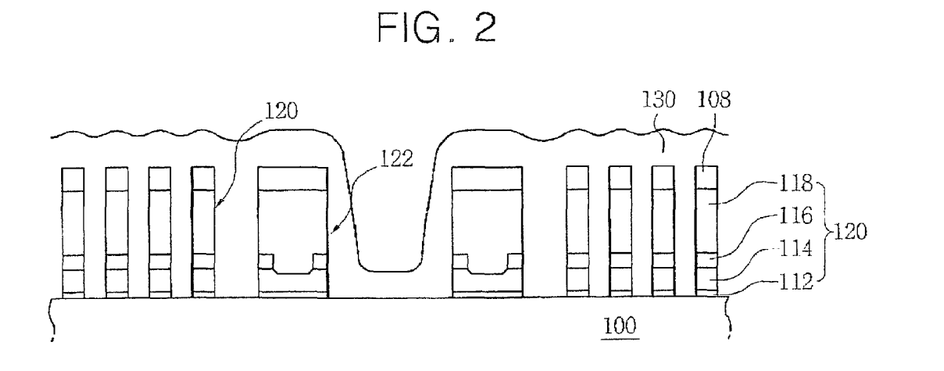
FIG. 2 is a cross-sectional view showing a method of depositing an oxide layer on the gate structure according to example embodiments.

As shown in FIG. 2, an oxide layer 130 may be formed on the semiconductor substrate 100, the gate structure 120, and the second gate structure 122 by a CVD process. The oxide layer 130, for example, a high temperature oxide (HTO), may be deposited to a thickness in a range of about 600 to 1000 Å.

Figure 3:
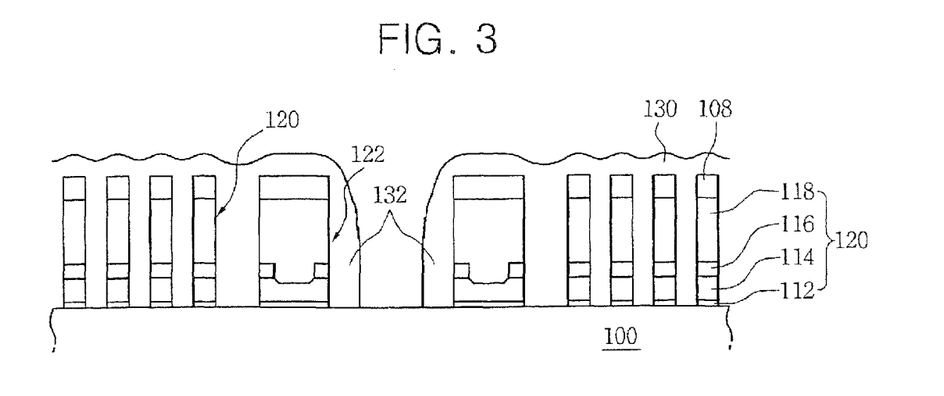
FIG. 3 is a cross-sectional view showing a method of etching an oxide layer to form a gate spacer according to example embodiments.

As shown in FIG. 3, the oxide layer 130 may be anisotropically etched to form a gate spacer 132 on either side wall of the gate structure 120. Using the gate spacer 132 as an ion-implantation mask, source/drain ion implantation may be performed.

Figure 4:
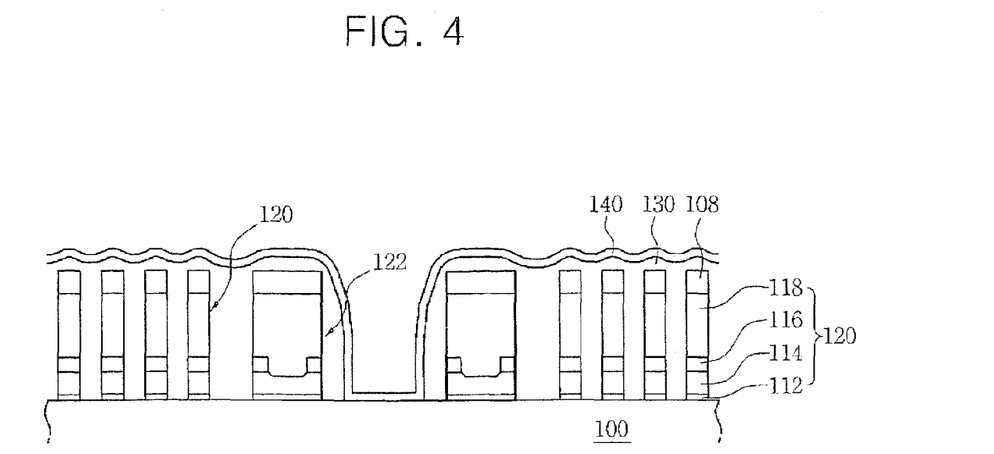
FIG. 4 is a cross-sectional view showing a method of depositing a polishing stop layer on the oxide layer according to example embodiments.

As shown in FIG. 4, a polishing stop layer 140 formed of silicon nitride (SiN) may be deposited on the entire surface of the semiconductor substrate 100 having the gate structures 120 by a blanket method.

Figure 5:
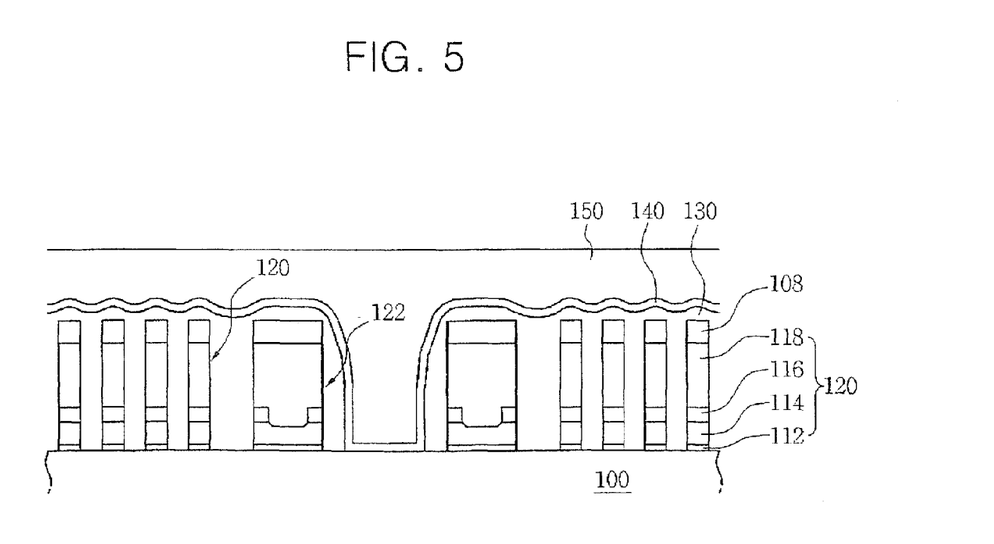
FIG. 5 is a cross-sectional view showing a method of depositing an interlayer insulating layer on the polishing stop layer according to example embodiments.

Then, on the polishing stop layer 140, an interlayer insulating layer 150 formed of oxide may be deposited to such a thickness to cover sufficiently the gate structure 120, as shown in FIG. 5.

Figure 6:
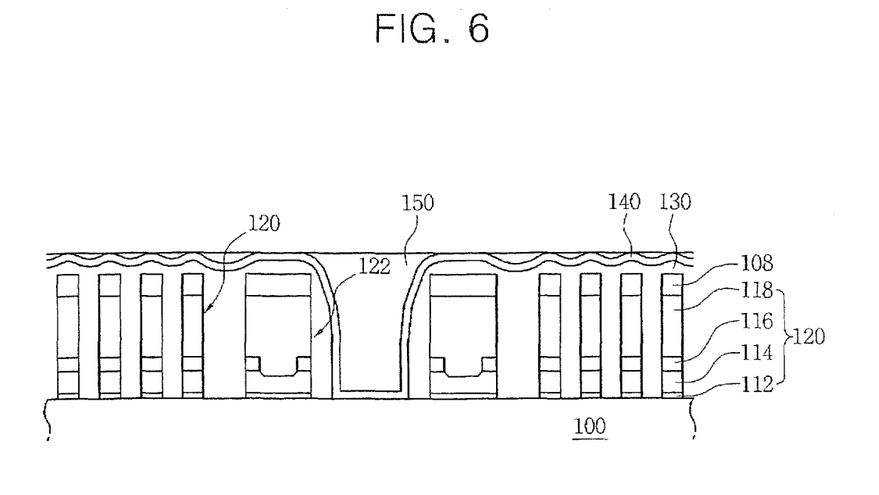
FIG. 6 is a cross-sectional view showing a method of polishing the interlayer insulating layer up to the surface of the polishing stop layer according to example embodiments.

After the deposition process, the interlayer insulating layer 150 may be removed up to the surface of the polishing stop layer 140 through a chemical mechanical polishing (CMP) process, as shown in FIG. 6. The planarization by the CMP process should be stopped over the polishing stop layer 140 such that the gate structures 120 are not damaged.

Figure 7:
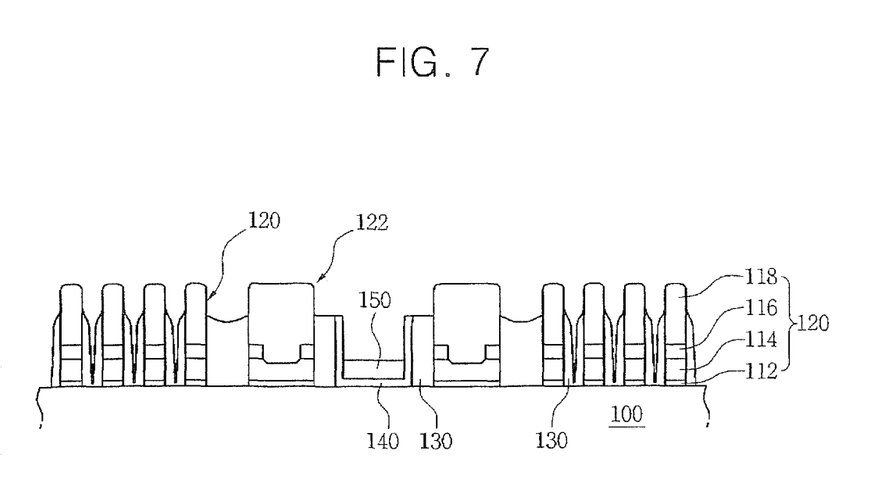
FIG. 7 is a cross-sectional view showing a method of etching back an insulating layer, a polishing stop layer, and an oxide layer such that the surface of the control gate is exposed according to example embodiments.

After the CMP process, the interlayer insulating layer 150, the polishing stop layer 140, the spacer oxide layer 130, and the mask oxide layer 108 may be etched back through a dry etching process such that the polysilicon surface of the control gate 118 may be exposed, as shown in FIG. 7. After dry-etching the polishing stop layer 140, it is possible to expose the surface of the gate structure 120 through a wet etching process. However, it may not be suitable for this process, at least because a serious loss of the spacer oxide layer 130 may be caused by isotropic etching using a wet chemical. At this time, when a dry etching process is performed to expose the surface of the gate structure 120, the following problems may occur.

Figure 8:
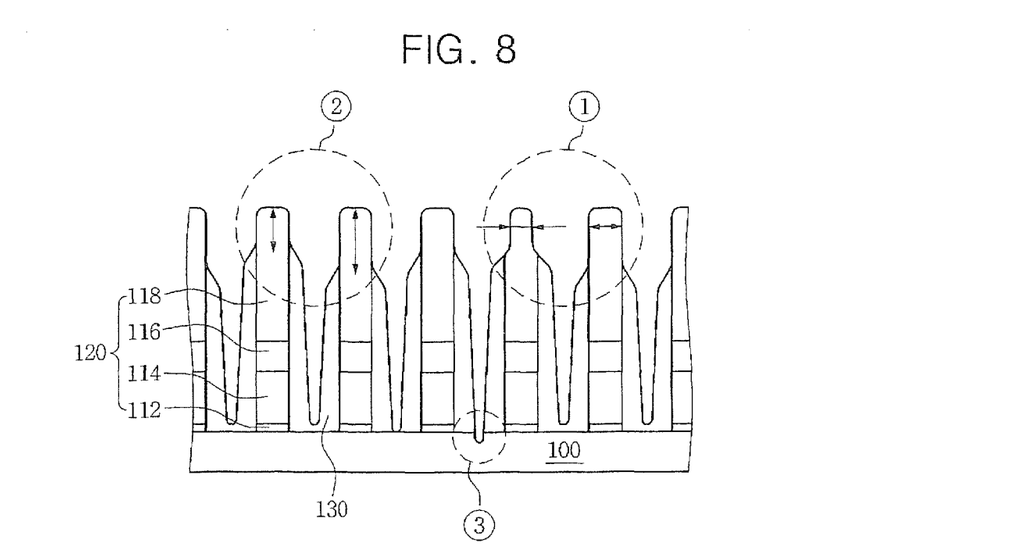
FIG. 8 is a cross-sectional view showing a state in which a loss occurs at an exposed portion of polysilicon, recesses are irregular, and a void is extended to touch the semiconductor substrate.

First, for example, when the polysilicon is exposed, the polishing stop layer 140, the spacer oxide layer 130, and the mask oxide layer 108 are removed, and simultaneously, the polysilicon is removed together. Therefore, as shown in FIG. 8, it can be found that the line width CD of the exposed portion of the polysilicon is significantly reduced in comparison with that of an unexposed portion of the polysilicon. As such, when the loss of the polysilicon occurs at the exposed portion during the exposure of the polysilicon, the width thereof is reduced (①of FIG. 8). In this case, when silicide (CoSi$_2$) is formed afterwards, the profile of the silicide layer is degraded. Further, since the removal of polysilicon is not uniformly performed, the exposed thickness of the polysilicon becomes non-uniform (②of FIG. 8).

Second, for example, as a design rule is reduced, the gate interval of a cell region decreases. Accordingly, a coupling ratio is reduced by parasitic capacitance between gates. Therefore, the capacitance formed by the floating gate 114 and the control gate 118 should be increased, in order to increase the coupling ratio. However, since the capacitance is proportional to an area, a method of increasing the height of the floating gate 114 to expand the area of the dielectric layer 116 is mainly used.

As such, as the design rule is reduced, the height of the stacked gate structure 120 increases, and the gate interval decreases. Therefore, a gate aspect ratio increases. When the oxide layer 130 is deposited on the semiconductor substrate 100 having a high gate aspect ratio, a void is formed between neighboring gates due to the poor step coverage of the oxide layer 130. In particular, such a void is remarkably extended in a memory cell region having a small gate interval.

When a recessing process is performed only by dry etching in such a state that a void is formed between gates, the oxide layer is non-uniformly opened, and an attack occurs on the semiconductor substrate 100 (③of FIG. 8). Further, when a subsequent metal layer such as cobalt is deposited and silicide is formed on the control gate 118 by silicidation reaction, the silicide may be formed even on the surface of the semiconductor substrate in some cases. Then, the characteristic of a cell transistor may be degraded.

Figure 9:
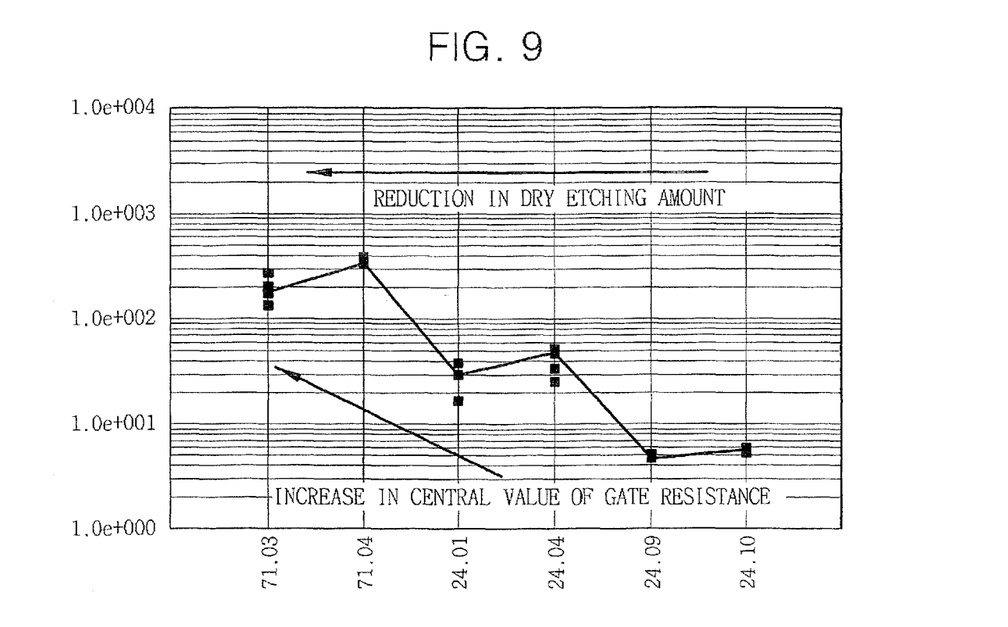
FIG. 9 is a graph showing a relationship between a dry etching amount and the central value of gate resistance according to example embodiments.

Third, for example, when the polysilicon loss is reduced to decrease the extension of the void and a dry etching amount is reduced to prevent the attack on the silicon semiconductor substrate, the central value of resistance Rs of the gate structure 120 increases, as shown in FIG. 9, and defective distribution of the silicide layer occurs.

For example, when a dry etching amount increases, a recess degree of the oxide layer 130 around the polysilicon increases. Further, as a reaction surface area widens, the gate resistance Rs decreases. On the other hand, when a dry etching amount is small, the recess degree of the oxide layer 130 decreases. Further, as a reaction surface area narrows, the gate resistance Rs increases. In particular, as the recess degree becomes variable, a change in the reaction surface area of the polysilicon increases. Accordingly, a formation amount of the silicide layer to be distributed becomes variable, and the gate resistance distribution become poor.

According to another example embodiment, however, the etching process may be divided into two operations, in order to minimize the polysilicon loss, to prevent an attack on the silicon semiconductor substrate, and/or to form a fine distribution of the silicide layer.

This example embodiment is the same as the above-described example embodiments, in that the interlayer insulating film is removed up to the surface of the polishing stop layer 140 through the CMP process. Therefore, the formation process of FIGS. 1 to 7 may be applied to this example embodiment. However, this example embodiment is different from the above-described embodiments in that a process of exposing polysilicon through just dry etching (JDE) and a process of recessing an oxide layer through chemical dry etching (CDE) may be combined to form a metal silicide layer.

Figure 16:
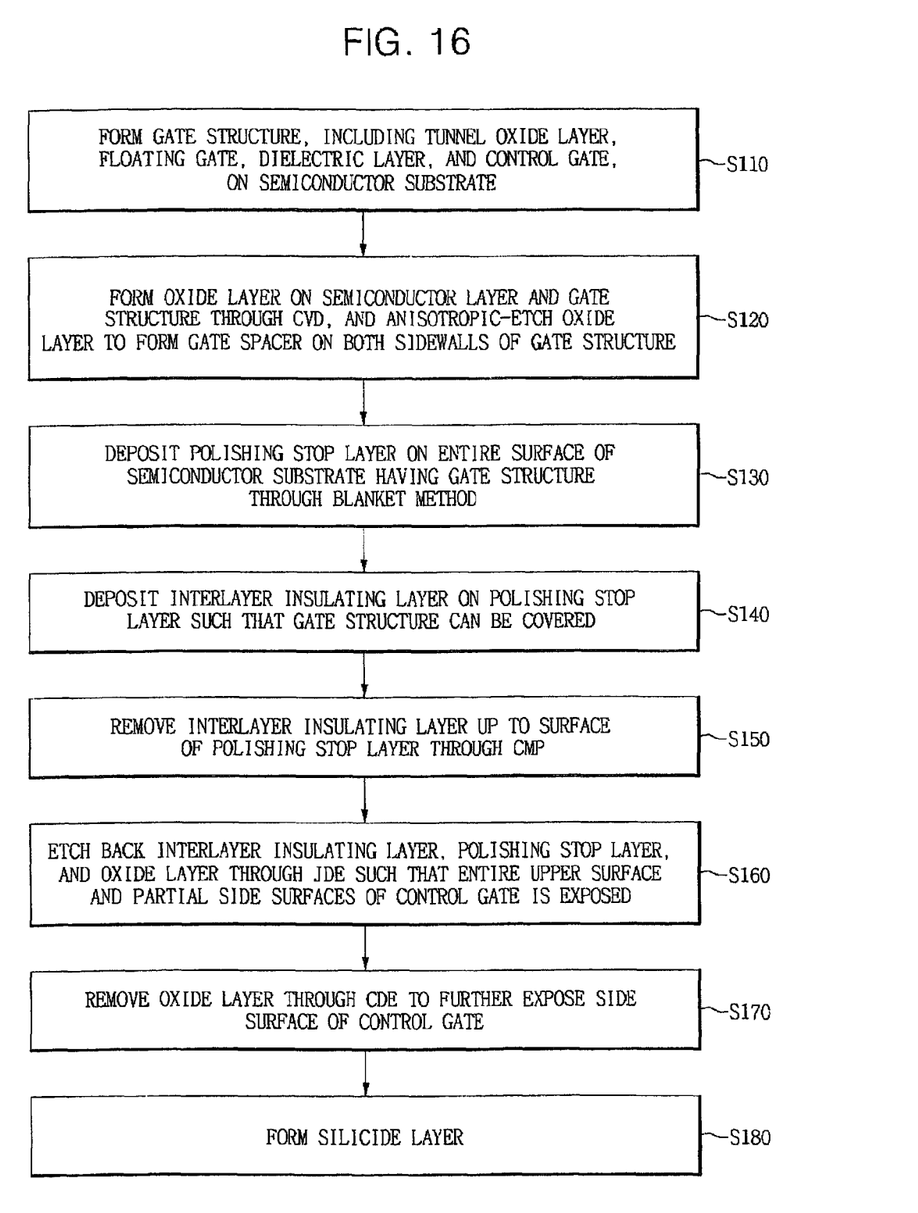
FIG. 16 is a flow chart showing a method of forming a metal silicide layer according to example embodiments.

More specifically, as shown in FIG. 16, this example embodiment is the same as the above-described example embodiment, in that this example embodiment includes forming a gate structure having a tunnel oxide pattern, a floating gate pattern, a dielectric pattern, and a control gate pattern, which are sequentially stacked, on a semiconductor substrate (S110), forming an oxide layer on the semiconductor substrate and the gate structure through a CVD process and anisotropically etching the oxide layer to form a gate spacer on either sidewall of the gate structure (S120), depositing a polishing stop layer formed of silicon nitride (SiN) on the entire surface of the semiconductor substrate having the gate structure through a blanket method (S130), depositing an interlayer insulating layer formed of oxide on the polishing stop layer to such a thickness that it can cover the gate structure (S140), and removing the interlayer insulating layer up to the surface of the polishing stop layer through a CMP process (S150).

Figure 17:
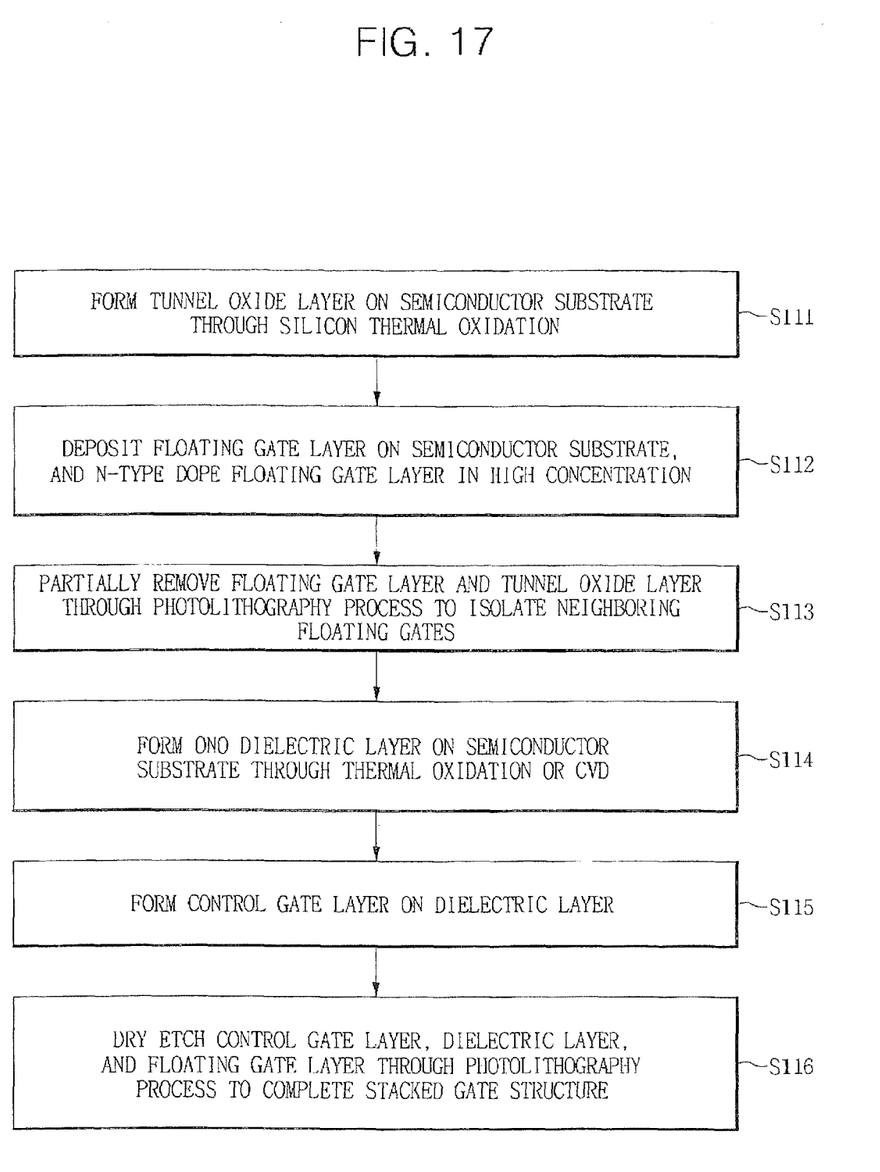
FIG. 17 is a flow chart showing a method of forming a stacked gate structure according to other example embodiments.

Further, as shown in FIG. 17, forming the gate structure (S100) may include forming a tunnel oxide layer formed of oxide on the semiconductor substrate through a thermal oxidation process (S111), depositing a floating gate layer formed of polysilicon on the semiconductor substrate having the tunnel oxide layer and highly doping the floating gate with n-type impurity ions (S112), partially removing the floating gate layer and the tunnel oxide layer through a photolithography process such that neighboring floating gate patterns are isolated from each other (S113), forming an ONO dielectric layer on the semiconductor substrate having the floating gate pattern through a thermal oxidation or CVD process, the ONO dielectric layer including a silicon dioxide ($SiO_2$) layer, a silicon nitride ($Si_3N_4$) layer, and a silicon dioxide ($SiO_2$) layer which may be sequentially combined (S114), forming a control gate layer formed of polysilicon on the dielectric layer (S115), and sequentially dry-etching the control gate layer and the dielectric layer through a photolithography process, thereby completing a stacked gate structure composed of a tunnel oxide pattern, a floating gate pattern, a dielectric pattern, and a control gate pattern (S116).

This example embodiment is different from the above-described embodiments in that this example embodiment includes etching back the interlayer insulating layer, the polishing stop layer, and the oxide layer through the JDE such that the entire upper surface and a partial side surface of the control gate are exposed (S160) and removing the oxide layer through the CDE such that the side surface of the control gate is further exposed (S170). Hereinafter, the following descriptions will focus on operations S160 and S170 and operation S180 in which a silicide layer is formed at portions including at least the exposed portion of the control gate.

Figure 10:
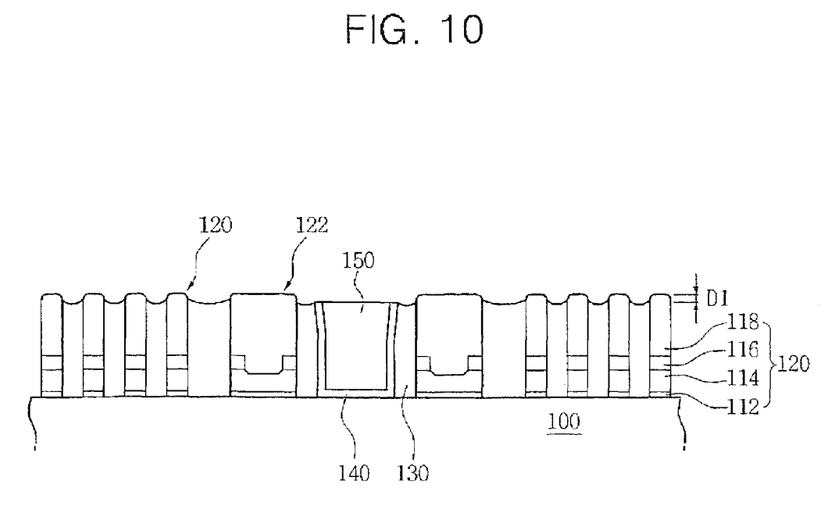
FIG. 10 is a cross-sectional view showing a method of exposing an upper surface of the polysilicon through JDE according to other example embodiments.

As shown in FIG. 10, after the CMP process, the mask (no reference numeral) remaining on the polishing stop layer 140 and the gate structure, and the spacer oxide layer 130 remaining between the gate structures may be removed through dry etching to expose the polysilicon. The dry etching functions merely to expose the entire surface or a partial side surface of the polysilicon and will be hereinafter referred to as JDE.

Therefore, the JDE is performed to such a degree that the polysilicon of the gate structure 120 is exposed. Therefore, as soon as the polysilicon is exposed, an etching end point may be determined to stop the dry etching. Even if over-etching occurs, it is desirable that the thickness D1 of the exposed portion of the polysilicon not exceed 200 Å. Then, the above-described void can be prevented from being extended, and an attack can be prevented from progressing.

Figure 11:
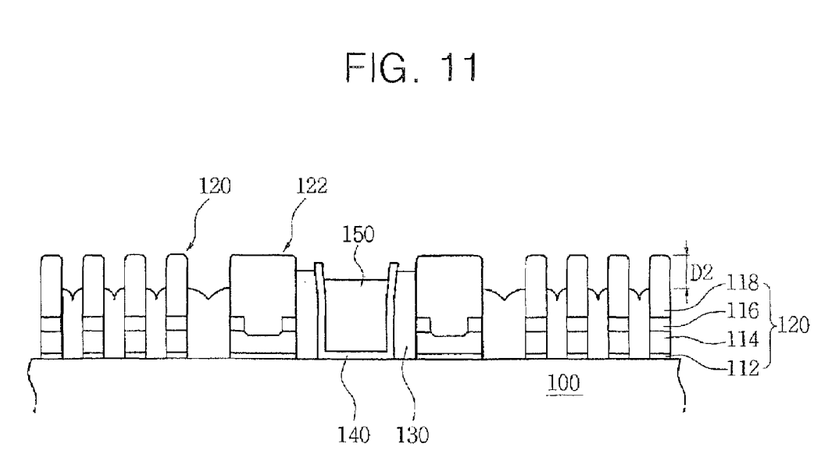
FIG. 11 is a cross-sectional view showing a method of exposing side surfaces of the polysilicon through CDE according to other example embodiments.

Next, as shown in FIG. 11, the oxide layer may be removed through CDE to completely open the polysilicon. As an example of the CDE, a chemical dry etch & pre-clean (CEP) process is taken herein. As shown in following Example (1), $NF_3/NH_3$ is dissociated using remote plasma. Through the dissociation, an etchant of $NH_4F$ and $NH_4F.HF$ can be formed. As other etchant sources, $HF/NH_3$, $N_2/H_2/NF_3$ and the like can be selected.

$NF_3+NH_3 \rightarrow NH_4F+NH_4F.HF$ <span>Example (1)</span>

The etchant has an etching ability. Therefore, the etchant is used to etch the oxide layer 130. As shown in Example (2), the etchant may react with an oxide ($SiO_2$) at a low temperature of 35° C. or less to produce solid by-products such as $(NH_4)_2SiF_6$.

$NH_4F$ or $NH_4F.HF+SiO_2 \rightarrow (NH_4)_2SiF_6(solid)+H_2O$ <span>Example (2)</span>

Further, as shown in Example (3), when the semiconductor substrate is reheated at a high temperature of 100° C. or more, the produced by-products are converted into gases such as $SiF_2/NH_3/HF$ and then sublimated. Therefore, they can be easily removed.

$(NH_4)_2SiF_6(solid) \rightarrow SiF_4(gas)+NH_3(gas)+HF(gas)$ <span>Example (3)</span>

Such a CDE process, in which the etchant produced at a low temperature reacts with an oxide to form by-products and the formed by-products are sublimated at a high temperature, can adjust an etching degree. Therefore, it can be expected that even when a void occurs, over-etching is minimized or prevented.

At this time, the etching end point of the CDE process may be determined at a point of time in which the thickness D2 of the exposed portion of the polysilicon reaches 500 to 1000 Å within the range that the ONO dielectric layer 116 is not exposed. Such an etching end point is suitable for the profile of a silicide layer to be subsequently formed.

Figure 12:
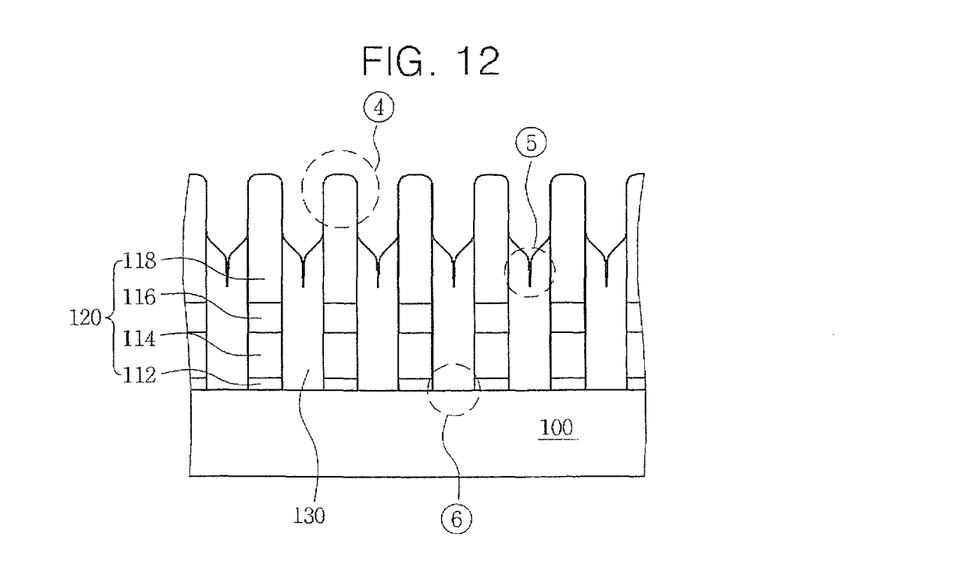
FIG. 12 is a cross-sectional view showing a state in which a loss is minimized at the exposed portion of the polysilicon through a combination of JDE and CDE, recesses are regular, and the silicon substrate is protected by the reduction of a void according to other example embodiments.

As such, when the polysilicon is opened to form line-and-space (L/S) configured interconnections in a self-aligned silicide (salicide) structure, the JDE process is primarily performed at the minimum level such that the polysilicon is exposed, and the CDE process is secondarily performed to completely expose the polysilicon and recess the oxide layer sufficient for salicide reaction. Then, as shown in FIG. 12, the loss of the polysilicon is minimized (④ of FIG. 12), and a tendency that the line width thereof narrows is reduced. Further, the prevention of over-etching suppresses the extension of a void at the spacer oxide layer between gates (⑤ of FIG. 12), and an attack on the semiconductor substrate is prevented (⑥ of FIG. 12).

Figure 13:
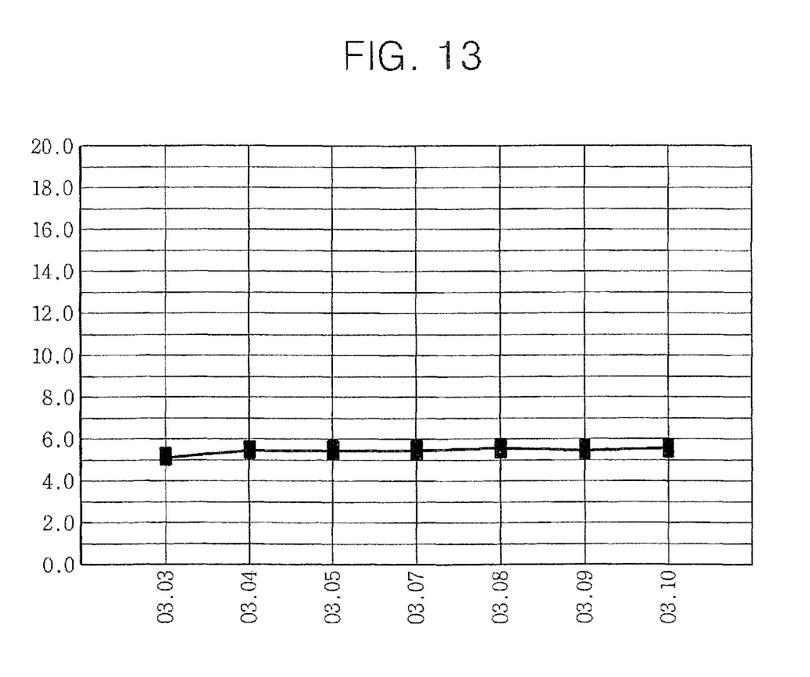
FIG. 13 is a graph showing a state in which the central value of gate resistance is stabilized at a low value regardless of dry etching according to other example embodiments.

In particular, the CDE process has a favorable selectivity with respect to the polysilicon. Therefore, when removing the oxide layer, the loss of the polysilicon is minimized substantially. Then, the line width is maintained substantially the same, and the profile of the silicide to be subsequently formed becomes favorable. Therefore, as the amount of the oxide layer to be removed increases, the central value of gate resistance Rs is stabilized at a low value, as shown in FIG. 13, and a distribution degree can be uniformly improved.

At this time, it can be found that when dry etching is performed according to an example embodiment, the thicknesses of the polishing stop layer 140 and the oxide layer 130 are equal to each other, as shown in FIG. 7. On the other hand, it can be found that when the JDE is performed and the CDE is then performed according to another example embodiment, the thicknesses of the polishing stop layer 140 and the oxide layer 130 are different from each other. That is, since the selectivity with respect to the polishing stop layer 140 is high in the CDE, the polishing stop layer 140 remains substantially the same, and the oxide layer 130 is further etched under the polishing stop layer 140.

Meanwhile, if the CMP is performed to such a degree that the upper surface of the polysilicon can be exposed, the JDE may be omitted, and the oxide layer can be recessed through the CDE.

Figure 14:
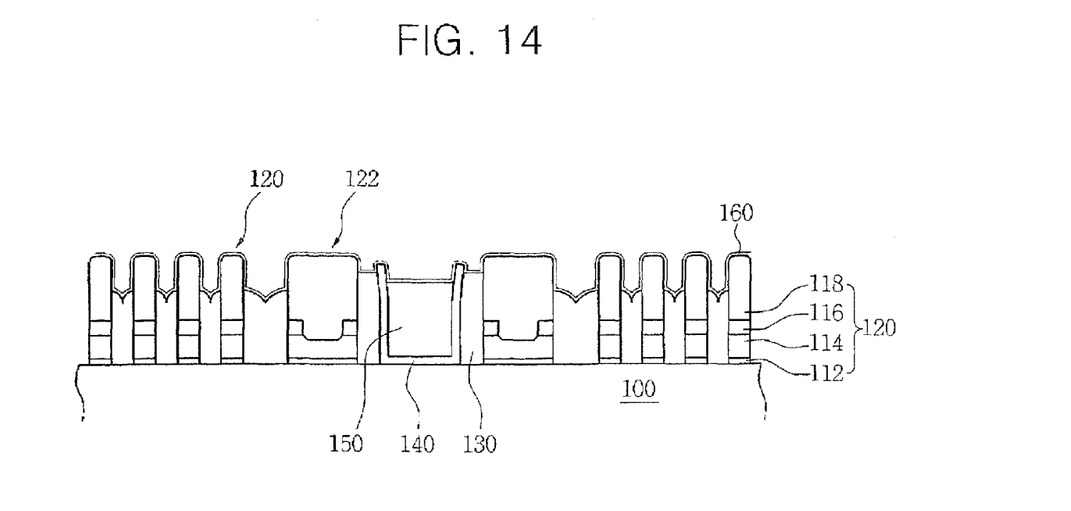
FIG. 14 is a cross-sectional view showing a method of depositing a metal layer on a semiconductor substrate including the gate structures according to other example embodiments.

As a subsequent process, a silicide layer is formed. First, the semiconductor substrate 100 is cleaned, and a metal layer 160 for forming silicide is deposited on the semiconductor substrate 100 including the gate structures 120 and 122, as shown in FIG. 14. As the metal layer 160, cobalt (Co), nickel (Ni), molybdenum (Mo), titanium (Ti) or the like may be used. As a capping layer (not shown) to be deposited in-situ with the metal layer, titanium nitride (TiN) is usually used.

Figure 15:
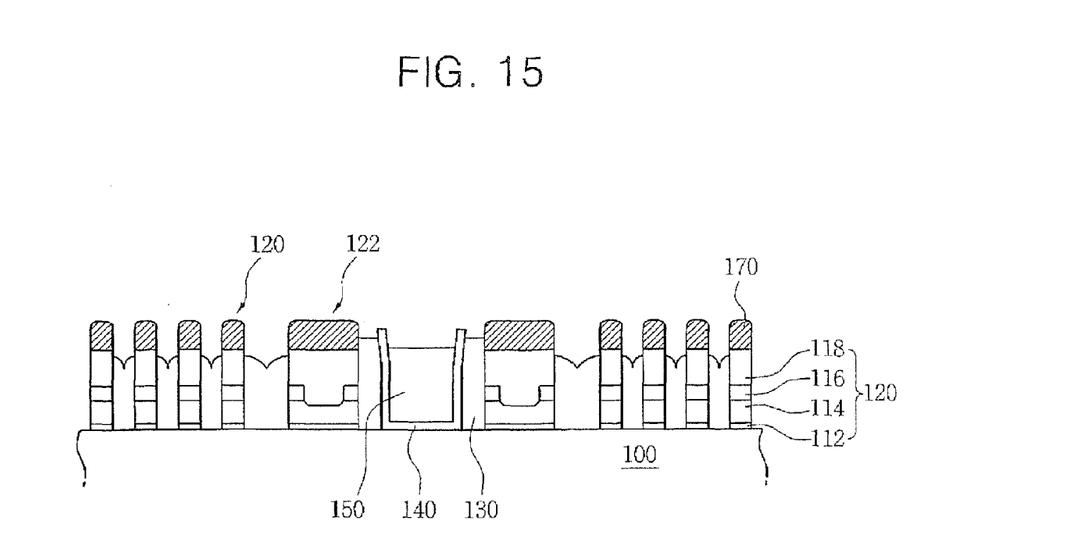
FIG. 15 is a cross-sectional view showing a method of forming a silicide layer through metal heat treatment according to other example embodiments.

As shown in FIG. 15, a first rapid thermal annealing (RTA) process for forming the silicide layer may be performed. Then, the exposed portion of the polysilicon reacts with the metal to form a cobalt (or another metal) silicide layer. After that, when stripping is performed using sulfuric acid or another chemical etching solution, the metal layer 160 having no silicide formed thereon (i.e., the metal layer and all the capping layers formed at the portions where the polysilicon is not exposed are removed) and a silicide layer 170 formed of Co, Ni, Mo, Ti or the like remains only at a desired portion. Subsequently, a secondary RTA process may be performed to stabilize the gate line resistance through stabilized phase formation.

Although not shown, when the metal layer 160 is deposited at a high temperature of 300° C. or more in order to improve resistance to the RTA process, and if a typical cleaning process and the deposition process of the metal layer 160 are performed after the CDE process, abnormal growth of the silicide layer 170 may occur. This may occur because high-temperature metals react with the polysilicon at the same time as the deposition to cause the movement of silicon. To improve this interaction, an oxidation treatment is required at a proper thickness on the surface of the polysilicon, before the metal layer 160 is deposited after the CDE process. At this time, an ashing process and a stripping process may be performed for the oxidation treatment.

As described above, since the pattern size of the polysilicon composing a gate decreases and the interval between patterns also decreases according to the high integration of memory cells, a void inevitably occurs between the gates when the spacer oxide layer is deposited. Then, the loss of the polysilicon occurs during the dry etching process for exposing the polysilicon and removing the oxide layer, the profile of the silicide layer formed on the polysilicon becomes poor, and the void may touch the silicon semiconductor substrate while being extended. To minimize this possibility of defect, the dry etching process for exposing the upper portion of the polysilicon and the chemical dry etching process for recessing the oxide layer around the polysilicon are combined in example embodiments. In particular, the chemical dry etching process involves dissociating $NF_3$ and $NH_3$ using remote plasma to form an etchant, forming solid by-products through the reaction with oxide of the oxide layer at a low temperature using the etchant as an etching solution, and annealing the by-products at a high temperature such that the by-products are sublimated into gases.

In example embodiments, it is possible to expect the following effects. First, as an example, since a large change may not occur in line width between an exposed portion and an unexposed portion of polysilicon, the profile of a silicide layer formed on the polysilicon becomes favorable. Second, as another example, although the step coverage of an oxide layer becomes poor and a void inevitably occurs between gates during the deposition of a spacer oxide layer, over-etching may be prevented while recessing the oxide layer. Therefore, a void does not touch a silicon active region. Third, as yet another example, since an etching amount does not need to be reduced in order to minimize the loss of the polysilicon, it is possible to minimize or prevent defective distribution in which the recess of the oxide layer decreases, the reaction surface area of the polysilicon narrows, and the central value of gate resistance increases.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of forming a metal silicide layer, comprising:
   forming line-and-space patterned gate structures on a semiconductor substrate;
   depositing an oxide layer on substantially the entire surface of the semiconductor substrate having the gate structures formed thereon;
   depositing a polishing stop layer on substantially the entire surface of the oxide layer;
   depositing an interlayer insulating layer on substantially the entire surface of the polishing stop layer;
   polishing the interlayer insulating layer up to the surface of the polishing stop layer;
   etching the interlayer insulating layer, the polishing stop layer, and the oxide layer through just dry etching (JDE) such that substantially the entire upper surface and partial side surfaces of the gate structures are exposed;
   recessing the oxide layer between gate structures through chemical dry etching (CDE) such that the side surfaces of the gate structures are further exposed; and
   forming a silicide layer at portions comprising at least the exposed portion of the gate structures.

2. The method according to claim 1, wherein the gate structures comprise a tunnel oxide pattern, a floating gate pattern, a dielectric pattern, and a control gate pattern which are sequentially stacked, the floating gate and the control gate comprise polysilicon, and the dielectric layer comprises an oxide-nitride-oxide (ONO) layer in which an oxide layer, a nitride layer, and an oxide layer are sequentially stacked.

3. The method according to claim 2, wherein an etching end point in the JDE is determined in such a range that a part of an exposed side surface of the polysilicon does not exceed about 200 Å.

4. The method according to claim 2, wherein an etching end point in the CDE is determined in such a range that the ONO dielectric layer is not exposed substantially and a portion of an exposed side surface of the polysilicon is about 500 to 1000 Å.

5. The method according to claim 2, wherein the CDE comprises:
   selecting an etchant source selected from the group consisting of a combination of $NF_3$ and $NH_3$, HF and $NH_3$, and a combination of $N_2$, $H_2$, and $NF_3$, dissociating the etchant source using plasma, remote plasma, or heat, and forming an etchant of $NH_4F$ and $NH_4F \cdot HF$ through the dissociation reaction;
   producing solid by-products of $(NH_4)_2SiF_6$ by reacting the etchant with an oxide at a low temperature; and
   applying high-temperature heat such that the produced by-products are converted into gas-phase $SiF_4$, $NH_3$, and NH and then removed.

6. The method according to claim 5, wherein the low temperature is equal to or less than about 35° C., and the high temperature is equal to or more than about 100° C.

7. The method according to claim 2, wherein forming the silicide layer at the exposed portion of the polysilicon comprises:
   depositing a metal layer in-situ with a capping layer formed of titanium nitride (TiN) to cover at least the exposed surface of the polysilicon using a metal selected from the group consisting of cobalt (Co), nickel (Ni), molybdenum (Mo), and titanium (Ti);
   performing a first rapid thermal annealing (RTA) process on the metal layer and the capping layer such that the polysilicon and the metal layer react to form a metal silicide layer;

stripping the metal layer and the capping layer deposited at unexposed portions of the polysilicon; and performing a second RTA process on the metal silicide layer to yield a stable phase.

8. The method according to claim 7, wherein when the metal layer comprising Co, Ni, Mo, or Ti is deposited at a high temperature of about 300☐ or more, a predetermined amount of oxide layer is formed on the polysilicon after the CDE, to reduce abnormal growth of the silicide layer.

9. A method of forming a metal silicide layer of a semiconductor device, comprising:

polishing an upper portion of line-and-space patterned polysilicon structures with an oxide layer interposed thereon and therebetween;

recessing the oxide layer on the polysilicon structures through just dry etching (JDE) and exposing at least an upper surface of the polysilicon structures;

recessing further the oxide layer between the polysilicon structures through chemical dry etching (CDE) and exposing farther side surfaces of the polysilicon structures; and forming a silicide layer on the polysilicon structures through metal deposition.

10. The method according to claim 9, wherein the CDE comprises:

dissociating $NF_3$ and $NH_3$ using plasma to form an etchant of $NH_4F$ and $NH_4F.HF$;

producing solid by-products of $(NH_4)_2SiF_6$ by reacting the etchant with an oxide at a temperature of about 35° C. or less; and annealing the by-products at a temperature of about 100° C. or more such that solid-phase $(NH_4)_2SiF_6$ is sublimated into gas-phase $SiF_4$, $NH_3$, and $HF$.

11. The method according to claim 9, wherein an etching end point in the JDE is determined in such a range that a part of an exposed side surface of the polysilicon does not exceed about 200 Å.

12. The method according to claim 10, wherein an etching end point in the CDE is determined in such a range that a portion of an exposed side surface of the polysilicon does not exceed about 1000 Å.

13. The method according to claim 1, when the JDE and the CDE are performed, a top level of the oxide layer is lower than a top level of the polishing stop layer.

14. A method of forming a metal silicide layer, comprising:

forming gate structures on a semiconductor substrate;

forming an oxide layer covering the gate structures;

forming a polishing stop layer on the oxide layer;

depositing an interlayer insulating layer on the polishing stop layer;

planarizing the interlayer insulating layer until the polishing stop layer is exposed;

etching the interlayer insulating layer, the polishing stop layer, and the oxide layer by just dry etching (JDE) until a vertical height of an exposed portion of the gate structures does not exceed about 200 Å;

recessing the oxide layer between gate structures by chemical dry etching (CDE); and forming a silicide layer on the exposed portion of the gate structures.

15. The method according to claim 14, wherein each of the gate structures comprises a tunnel oxide pattern, a floating gate pattern, a dielectric pattern, and a control gate pattern which are sequentially stacked, the tunnel oxide pattern, the floating gate pattern and the dielectric pattern are covered by the oxide layer after the JDE and the CDE are performed.

16. The method according to claim 14, wherein the CDE comprises:

forming an etchant by dissociating $NF_3$ and $NH_3$ using remote plasma;

reacting the etchant with the oxide layer at a temperature of about 35° C. or less;

heating the semiconductor substrate at a temperature of about 100° C. or more.

17. The method according to claim 16, wherein reacting the etchant with the oxide layer at a temperature of about 35° C. or less includes forming solid by-products, and wherein heating the semiconductor substrate at a temperature of about 100° C. or more includes converting the solid by-products into gases.

18. The method according to claim 14, wherein recessing the oxide layer by CDE includes making the upper surface of the oxide layer lower than the upper surface of the polishing stop layer.

* * * * *